(12) United States Patent
Lu et al.

(10) Patent No.: US 7,952,229 B2
(45) Date of Patent: May 31, 2011

(54) POWER DISTRIBUTION SYSTEM

(75) Inventors: Yi-Chang Lu, Taipei (TW);
Cheng-Hung Li, Taipei (TW);
Chung-Yui Kuo, Taipei (TW);
Tsung-Yu Wu, Tainan (TW)

(73) Assignees: Himax Technologies Limited, Tainan County (TW); National Taiwan University, Taipei (TW)

( * ) Notice: Subject to any disclaimer, the term of this patent is extended or adjusted under 35 U.S.C. 154(b) by 183 days.

(21) Appl. No.: 12/393,994

(22) Filed: Feb. 26, 2009

(65) Prior Publication Data

US 2010/0213764 A1      Aug. 26, 2010

(51) Int. Cl.
*H05K 1/02*      (2006.01)
(52) U.S. Cl. .......................................................... 307/42
(58) Field of Classification Search ................... 307/42; 257/207; 365/226; 716/9, 10
See application file for complete search history.

(56) References Cited

U.S. PATENT DOCUMENTS

| | | | |
|---|---|---|---|
| 5,598,363 A * | 1/1997 | Uchida | 365/63 |
| 6,359,502 B1 * | 3/2002 | Endou | 327/545 |
| 7,199,472 B2 * | 4/2007 | Minami et al. | 257/758 |
| 7,305,571 B2 * | 12/2007 | Cranford et al. | 713/300 |
| 7,791,369 B2 * | 9/2010 | Kamo et al. | 326/33 |
| 7,808,804 B2 * | 10/2010 | Kwon | 365/51 |

* cited by examiner

*Primary Examiner* — Albert W Paladini
(74) *Attorney, Agent, or Firm* — Stout, Uxa, Buyan & Mullins, LLP

(57) ABSTRACT

A power distribution system is disclosed. The system includes a first power line and a second power line laid out on a substrate. The first power line is spaced apart from the second power line. The system also includes at least one conductive connecting line that electrically couples the first power line at one end and the second power line at another end. A power supply supplies power to the first power line and the second power line. A supply node on the conductive connecting line is then used to provide the supplied power.

18 Claims, 6 Drawing Sheets

POWER DISTRIBUTION SYSTEM

BACKGROUND OF THE INVENTION

1. Field of the Invention

The present invention generally relates to a power distribution system, and more particularly to a power line layout.

2. Description of the Prior Art

A structure commonly referred to as the metal power line is one of the important elements in the power distribution system of a chip, a printed circuit board, or a package. The power line provides a path or way for transferring a supplied power, such as $V_{DD}$, to a variety of circuits or electronic components in an entire electronic system. FIG. 1 schematically shows a conventional power line 10 that consists of a rectangular plane metal wire laid out on a substrate 12, while other circuits or electronic components are left out in the figure. The power supply (not shown in the figure) typically supplies the power at both ends (A and B) of the power line 10.

FIG. 2 shows an equivalent schematic of the power line 10 that consists of series-connected resistors R (e.g., with four representative resistors R being shown in the figure). Current sources I respectively represent current drawn away from the interconnecting nodes of the resistors R by other circuits or electronic components (not shown).

According to the equivalent schematic of FIG. 2, the IR drop at or near either end (A or B) has a greater rate of change than the middle node (M) as a consequence of the supplied current at either end (A or B) being greater than that at the middle node M. FIG. 3 shows an exemplary relationship curve between the IR (current times resistance) voltage drop and the distance traveled along the power line 10. According to the figure, the curve has a slope that is greater at or near either end than at the middle.

As the number of electronic components (such as transistors) has been increasing and the operating voltage of the electronic components has been decreasing in modern integrated circuits, the IR drop more substantially affects the operation of the electronic components, or even causes the circuits to malfunction.

For the reason of a conventional power line having a substantive IR drop problem, particularly at the ends of the power line, a need has arisen to propose a novel power distribution system that can improve or eliminate this IR drop effect.

SUMMARY OF THE INVENTION

In view of the foregoing, it is an object of the present invention to provide a power distribution system that can improve or eliminate the IR drop effect.

According to the embodiments disclosed herein, a first power line and a second power line are laid out on a substrate. The first power line is spaced apart from the second power line. At least one conductive connecting line electrically couples the first power line at one end and the second power line at another end. A power supply supplies power at a first power-supplied node on the first power line, and at a second power-supplied node on the second power line, wherein the first power-supplied node is located at a side opposite to a side of the second power-supplied node. A supply node on the conductive connecting line is then used to provide the supplied power. In one embodiment, the first and the second power line have rectangular shapes. In another embodiment, the first and the second power lines have varied width in a lateral direction. Specifically, the width of the first power line at the first power-supplied node or the width of the second power line at the second power-supplied node is greater than the width at other node on the first or the second power line. Accordingly, the disclosed power distribution system can substantially improve or even eliminate the IR drop effect.

DETAILED DESCRIPTION OF THE INVENTION

Figure 4:
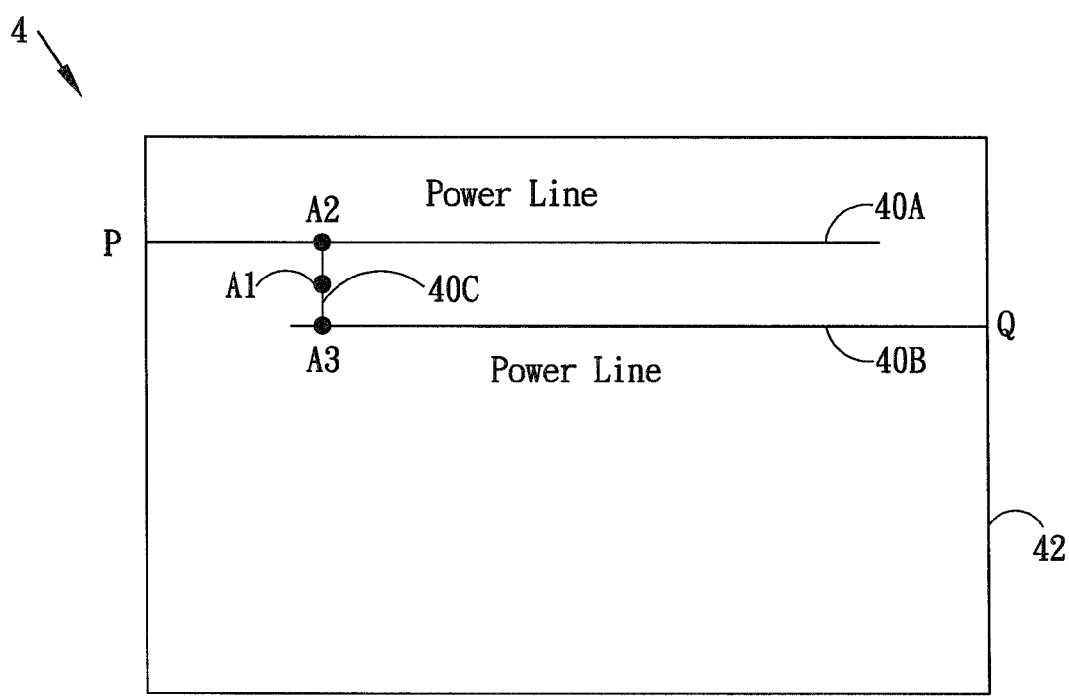
FIG. 4 illustrates a power distribution system according to a first embodiment of the present invention.

FIG. 4 illustrates the layout of a power distribution system 4 according to a first embodiment of the present invention. The power distribution system 4 may be manufactured, for example, on or in a chip, a printed circuit board, or a package. The power distribution system 4 provides a path or way for transferring a supplied power, such as $V_{DD}$, to a variety of circuits or electronic components in an entire electronic system. In the embodiment, the power distribution system 4 includes at least two conductive (e.g., metal) power lines 40A and 40B that are spaced apart by a distance, and are laid out on a substrate 42. The ground line or lines are omitted in the figure for brevity. In one embodiment, the first power line 40A and the second power line 40B may be laid out on the same level plane of a chip, a printed circuit board, or a package. Alternatively, according to another embodiment, the first power line 40A and the second power line 40B may be laid out on different level planes.

Figure 5A:
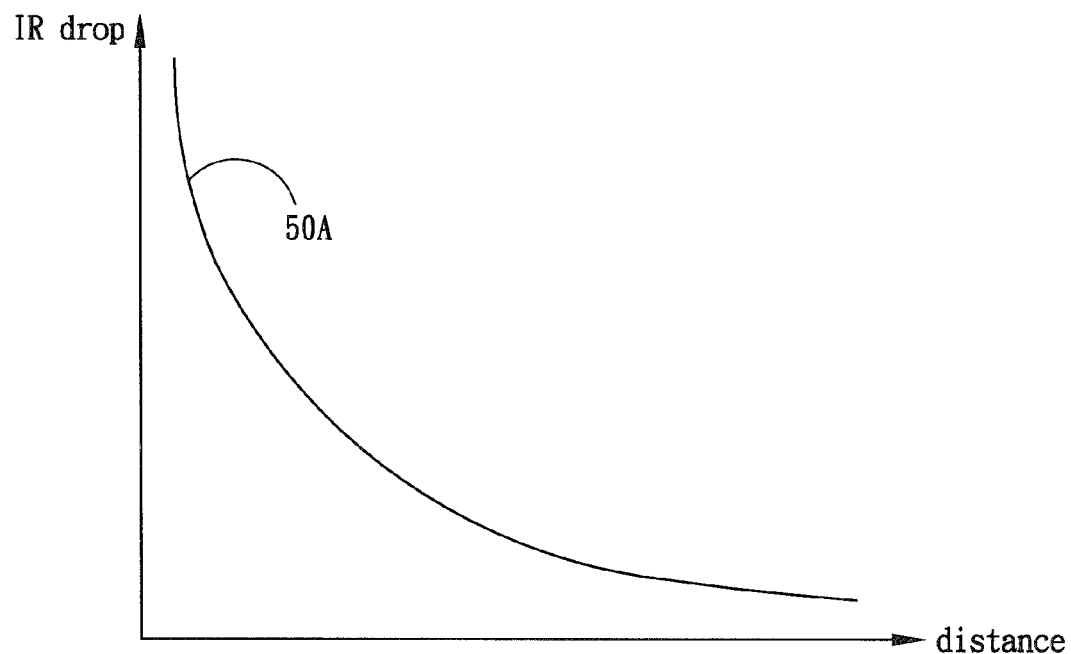
FIG. 5A shows an exemplary relationship curve between the IR drop and the distance traveled (from left to right) along the first power line of FIG. 4.
Figure 5B:
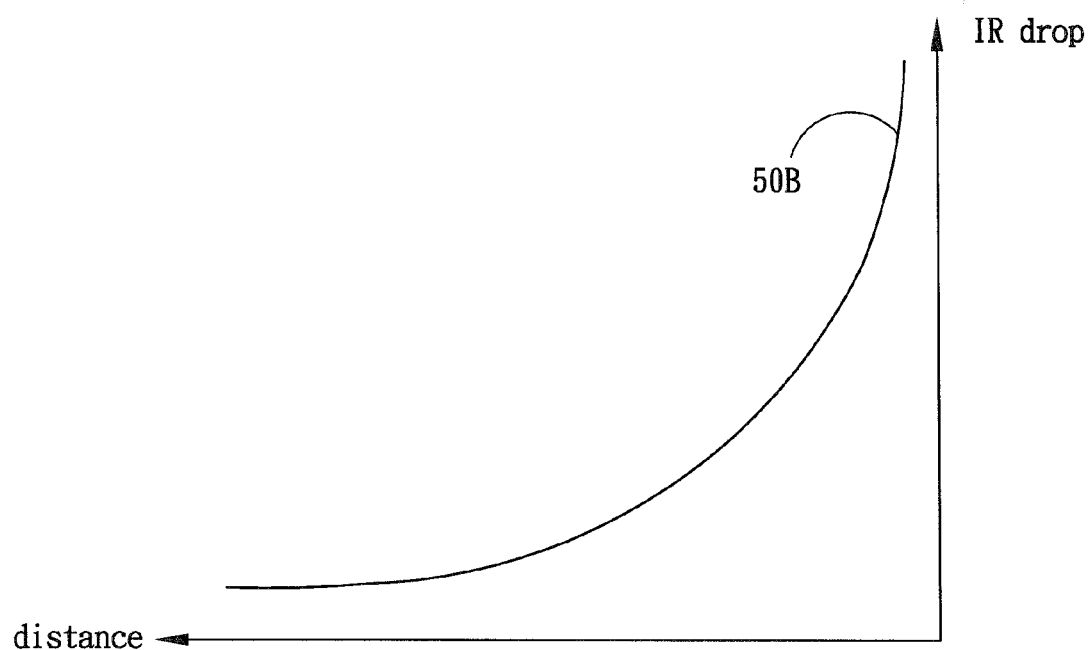
FIG. 5B shows an exemplary relationship curve between the IR drop and the distance traveled (from right to left) along the second power line of FIG. 4.

A power supply (not shown in the figure) supplies power, such as $V_{DD}$, at one (left) end P of the first power line 40A, and supplies power at one (right) end Q of the second power line 40B. That is, a first power-supplied node (e.g., node P) is located at a side opposite to, opposing, and/or substantially and/or functionally spaced apart from, a side of a second power-supplied node (e.g., node Q). FIG. 5A shows an exemplary relationship curve 50A between the IR (current times resistance) voltage drop and the distance traveled (from left to right) along the first power line 40A. The curve 50A indicates that the IR drop at or near the (left) end P has a greater rate of change (or slope) than other nodes. FIG. 5B shows an exemplary relationship curve 50B between the IR drop and the distance traveled (from right to left) along the second power line 40B. The curve 50B indicates that the IR drop at or near the (right) end Q has a greater rate of change (or slope) than other nodes.

Referring again to FIG. 4, the power lines 40A and 40B are further electrically coupled by at least one conductive (e.g., metal) connecting line 40C. In a typical embodiment, the conductive connecting line 40C may be laid out on the same level plane as either power line 40A or 40B. Alternatively, another embodiment may comprise the conductive connecting line 40C being laid out on a level plane different from that of either power line 40A or 40B.

Figure 5C:
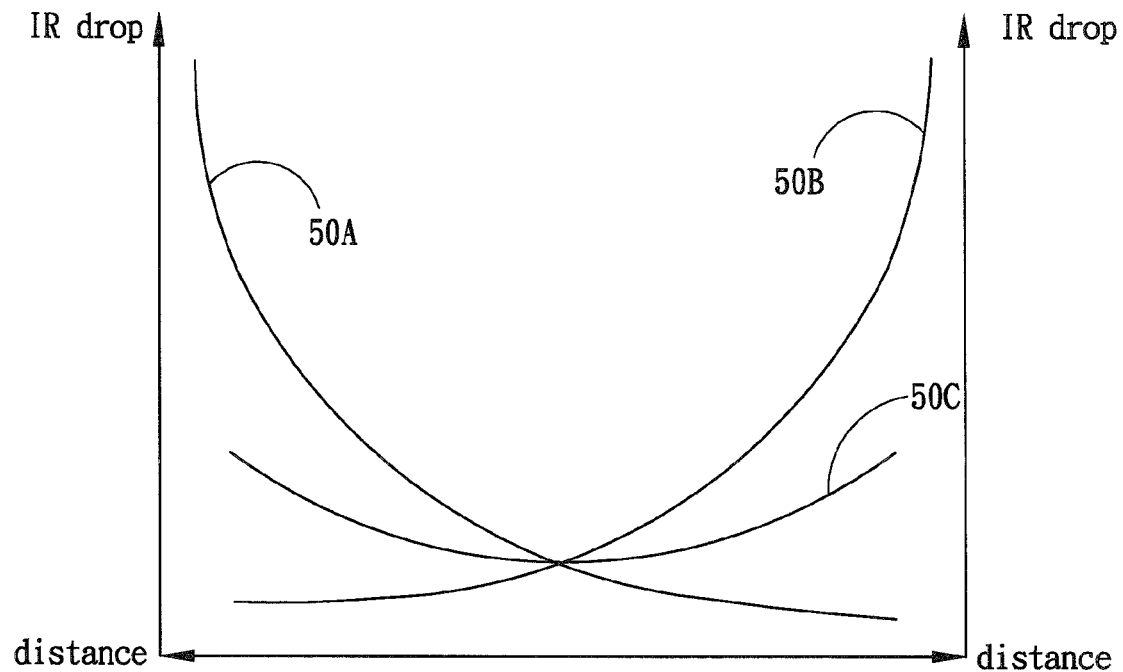
FIG. 5C shows a resultant average IR (current times resistance) voltage drop curve along with the IR drop curve of FIG. 5A and the IR drop curve of FIG. 5B.

A middle (supply) node A1 or a (supply) node near the middle node between node A2 and node A3 on the conductive connecting line 40C is then used to provide the transferred supplied power, such as $V_{DD}$, to circuit(s) or electronic component(s) in the entire electronic system. As used herein, the term "near" is defined to mean that a node near the middle node is closer to the middle node than to the end node, and is preferably located within, for example, 20% of the distance between the middle node (A1) and the end node (A2/A3). As a result, the middle node(s) (e.g., A1) on the conductive connecting line(s) have an IR drop that is about equal to an average of that at the node A2 and that at the node A3. FIG. 5C shows a resultant average IR drop curve 50C along with the IR drop curve 50A for the first power line 40A and the IR drop curve 50B for the second power line 40B. The resultant average IR drop curve 50C has a substantially flattened curvature relative to that of the IR drop curves 50A and 50B. According to the resultant average IR drop curve 50C, the power distribution system 4 (i.e., the power lines/connecting line [40A/40B/40C]) can substantially improve or even eliminate the IR drop effect.

Figure 6A:
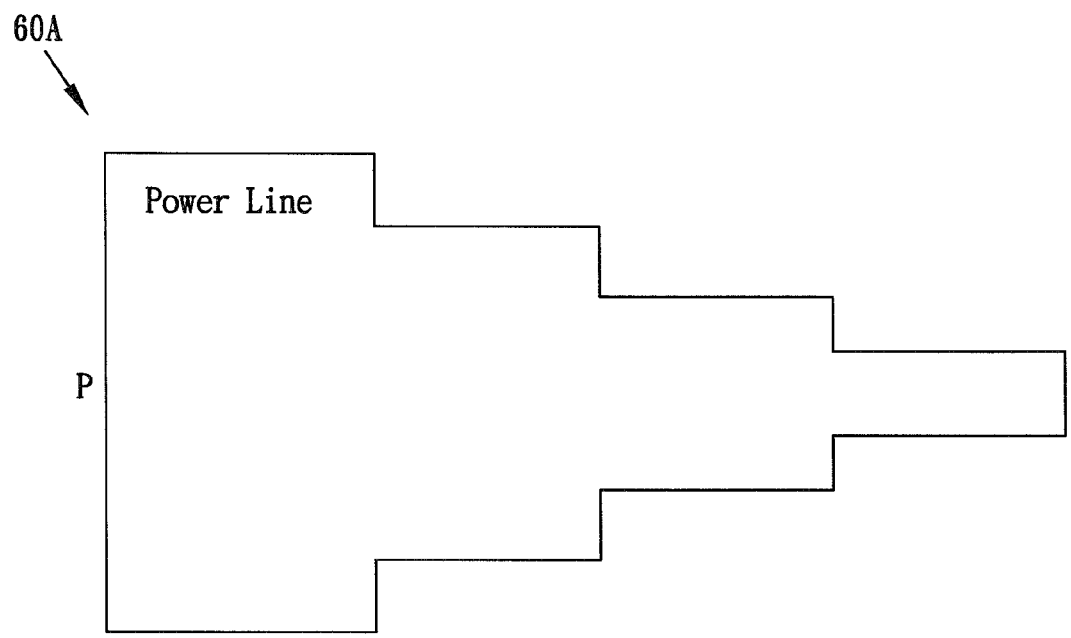
FIG. 6A and FIG. 6B show power lines that have varied width in the lateral direction according to a second embodiment of the present invention.
Figure 6B:
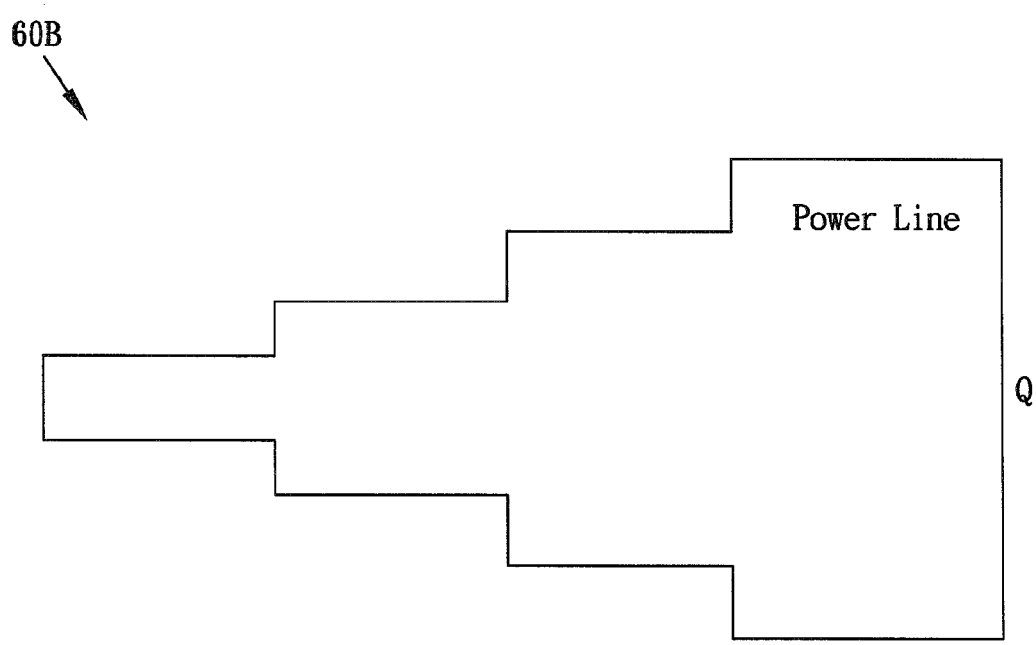

In a power distribution system according to a second embodiment of the present invention, the layout of power lines is the same as that shown in FIG. 4, but distinct power lines 60A and 60B shown in FIGS. 6A and 6B substitute for the (rectangular or line shaped) power lines 40A and 40B, respectively. The first power line 60A has varied width in the lateral direction, which decreases along the longitudinal direction (or from left to right in the figure). The second power line 60B also has varied width in the lateral direction, which decreases along the longitudinal direction (or from right to left in the figure). In other words, the first power line 60A has wide width at or near the first power-supplied end P, and has narrow width at the other end of the first power line 60A. Likewise, the second power line 60B has wide width at or near the second power-supplied end Q, and has narrow width at the other end of the second power line 60B. In a preferred embodiment, the width of the first power line 60A monotonically decreases in a direction away from the first power-supplied node P, and the width of the second power line 60B monotonically decreases in a direction away from the second power-supplied node Q. In the embodiment, the first power line 60A or the second power line 60B has a two-sided or one-sided stepwise edge. In a modified embodiment, the amount of steps may greatly increase, and/or each step height may greatly decrease, such that the edge becomes or approaches being continuous instead of being stepwise.

Figure 1:
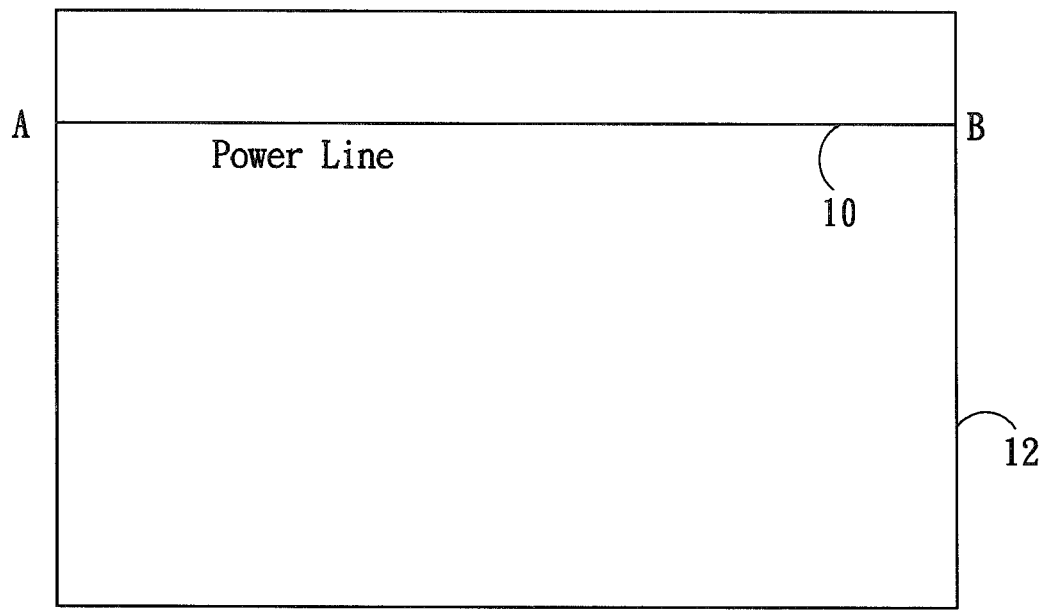
FIG. 1 schematically shows a conventional power line.
Figure 2:
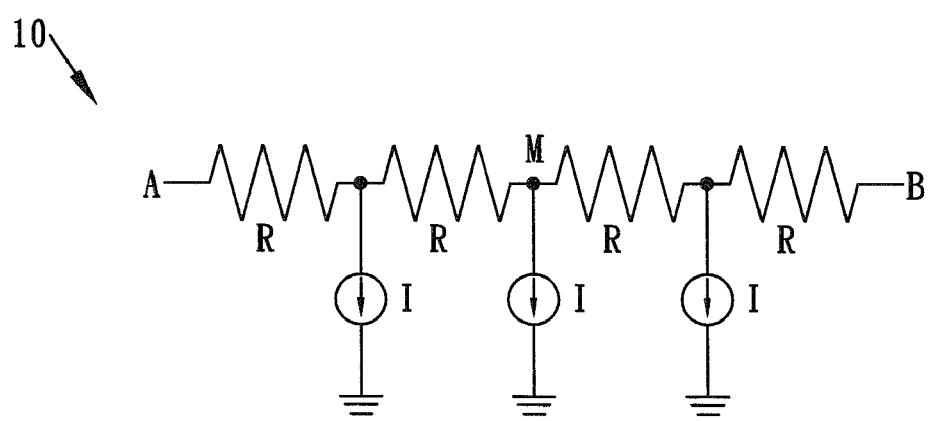
FIG. 2 shows an equivalent schematic of the power line of FIG. 1.
Figure 3:
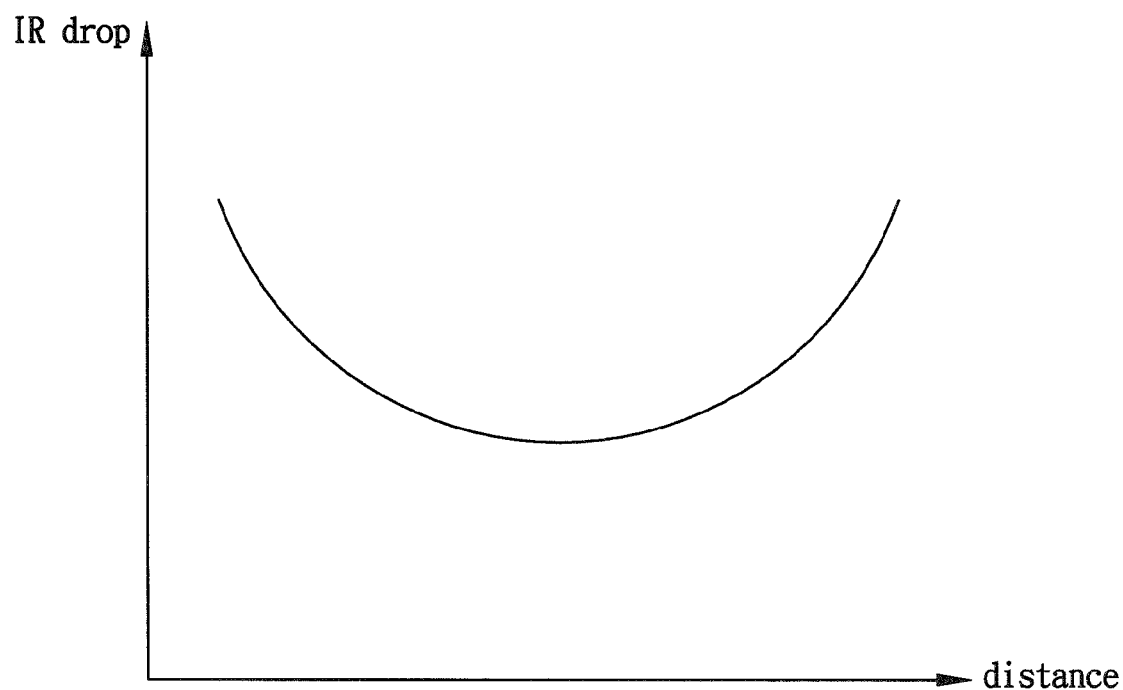
FIG. 3 shows an exemplary relationship curve between the IR drop and the distance traveled along the power line of FIG. 1.

As the resistivity R is inversely proportional to the width of the power line 60A/60B, the resistivity R at the power-supplied node (P or Q) is smaller than that at other nodes. Further, the supplied current I at the power-supplied node (P or Q) is larger than that at other nodes (see FIG. 2). As a result, the IR drop of the power line 60A or 60B has an approximately equal rate of change (or slope) along the longitudinal direction.

Figure 7A:
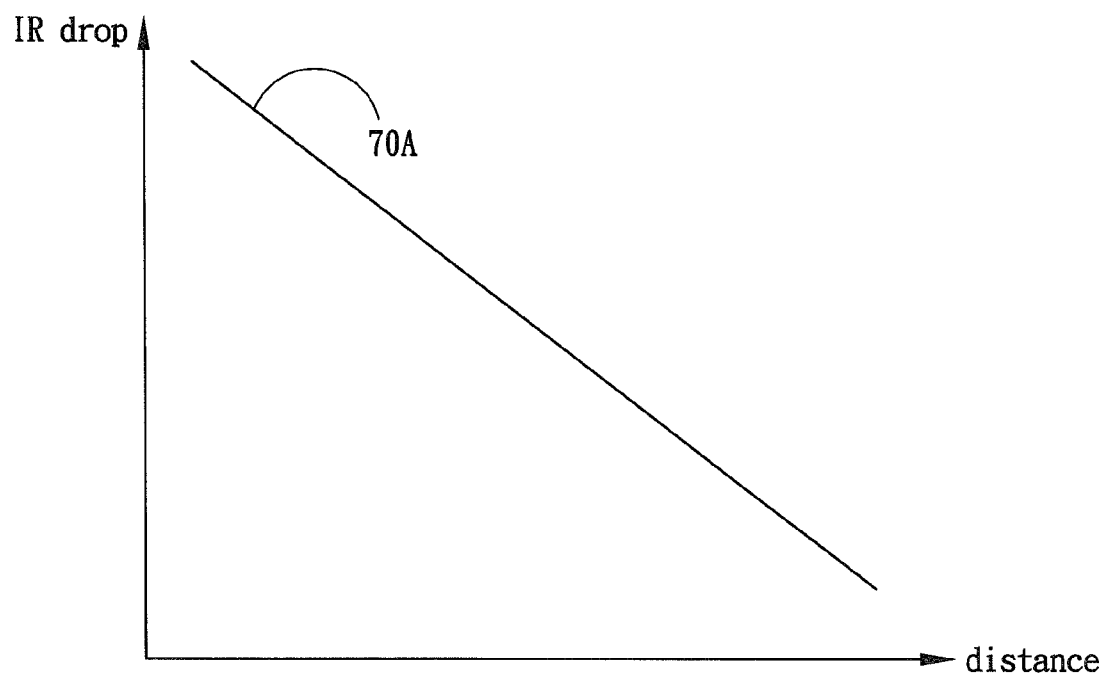
FIG. 7A shows an exemplary relationship curve between the IR drop and the distance traveled (from left to right) along the first power line of FIG. 6A.
Figure 7B:
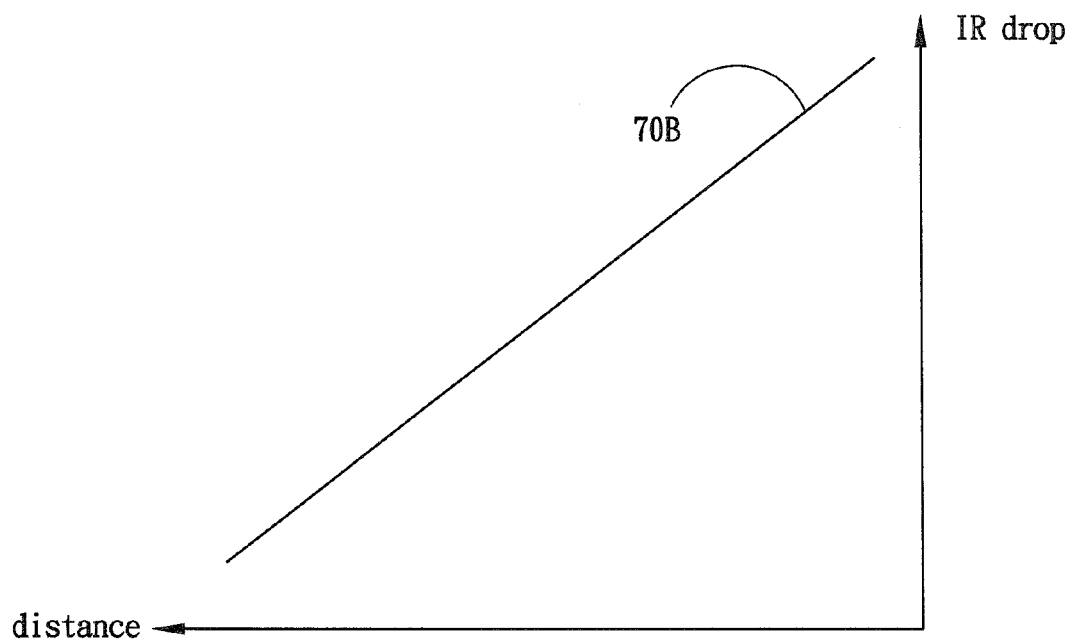
FIG. 7B shows an exemplary relationship curve between the IR drop and the distance traveled (from right to left) along the second power line of FIG. 6B.

FIG. 7A shows an exemplary relationship curve 70A between the IR drop and the distance traveled (from left to right) along the first power line 60A. The linear curve 70A indicates that the IR drop everywhere has an approximately equal rate of change. FIG. 7B shows an exemplary relationship curve 70B between the IR drop and the distance traveled (from right to left) along the second power line 60B. The linear curve 70B indicates that the IR drop everywhere has an approximately equal rate of change.

Figure 7C:
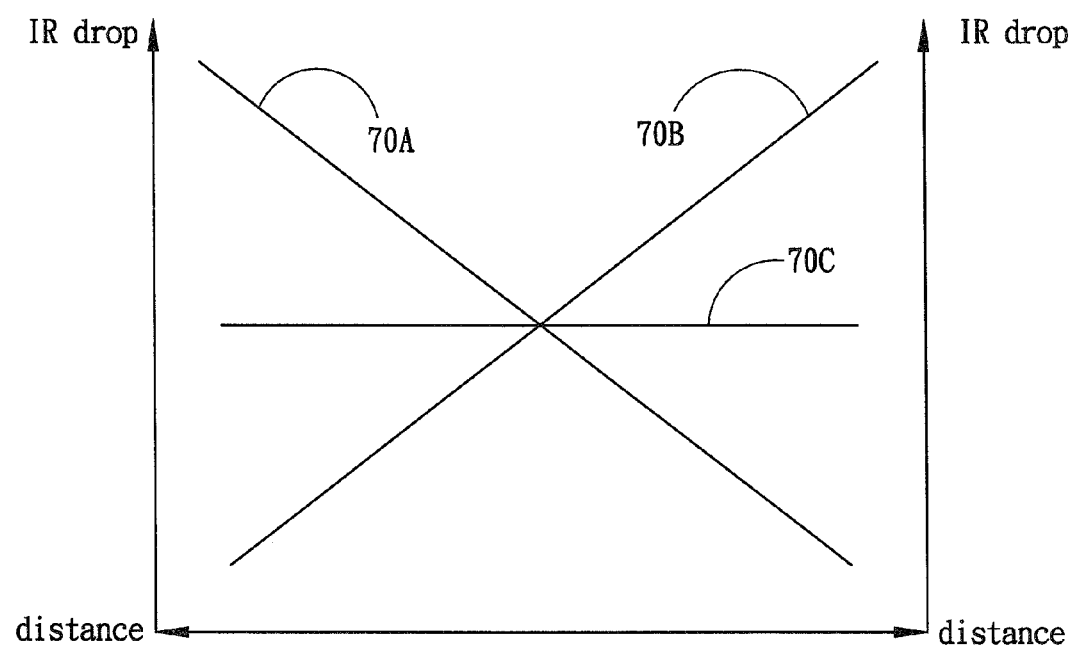
FIG. 7C shows a resultant average IR drop curve along with the IR drop curve of FIG. 7A and the IR drop curve of FIG. 7B.

The power lines 60A and 60B are further electrically coupled by at least one conductive connecting line, such as 40C in FIG. 4. The conductive connecting line 40C may have rectangular or other shape. The middle node A1 or a node near the middle node between node A2 and node A3 on the conductive connecting line 40C is then used to provide the transferred supplied power, such as $V_{DD}$, to circuit(s) or electronic component(s) in the entire electronic system. As a result, the middle node(s) (e.g., A1) on the conductive connecting line (s) have an IR drop that is about equal to an average of that at the node A2 and that at the node A3. FIG. 7C shows a resultant average IR drop curve 70C along with the IR drop curve 70A for the first power line 60A and the IR drop curve 70B for the second power line 60B. The IR drop curve 70C is approximately a horizontal line, and, accordingly, the power distribution system using the power lines 60A/60B can substantially eliminate the IR drop effect.

Although specific embodiments have been illustrated and described, it will be appreciated by those skilled in the art that various modifications may be made without departing from the scope of the present invention, which is intended to be limited solely by the appended claims.

What is claimed is:

1. A power distribution system, comprising:
  a first power line;
  a second power line spaced apart from the first power line;
  a substrate on which the first power line and the second power line are laid out; and
  at least one conductive connecting line each having a first end and a second end, wherein the first end is directly connected to the first power line and the second end is directly connected to the second power line,
  wherein a power supply supplies power at a first power-supplied node on the first power line, and at a second power-supplied node on the second power line, the first power-supplied node being located at a first side of the substrate and the second power-supplied node being located at a second side of the substrate, wherein the first side is opposite to the second side, and
  wherein a supply node on the conductive connecting line is used to provide the supplied power.

2. The system of claim 1, wherein the first power line, the second power line and the conductive connecting line are made on or in a chip, a printed circuit board or a package.

3. The system of claim 1, wherein the first power line and the second power line are laid out on a same level plane.

4. The system of claim 1, wherein the first power line and the second power line are laid out on different level planes.

5. The system of claim 1, wherein the conductive connecting line is laid out on a same level plane as either the first power line or the second power line.

6. The system of claim 1, wherein the conductive connecting line is laid out on a level plane different from that of either the first power line or the second power line.

7. The system of claim 1, wherein the supply node on the conductive connecting line is near a middle of the conductive connecting line.

8. The system of claim 1, wherein the first power line and the second power line have rectangular shape.

9. A power distribution system, comprising:
a first power line having varied width in a lateral direction;
a second power line having varied width in the lateral direction, and being spaced apart from the first power line;
a substrate on which the first power line and the second power line are laid out; and
at least one conductive connecting line each having a first end and a second end, wherein the first end is directly connected to the first power line and the second end is directly connected to the second power line,
wherein a power supply supplies power at a first power-supplied node on the first power line, and at a second power-supplied node on the second power line, the first power-supplied node being located at a first side of the substrate and the second power-supplied node being located at a second side of the substrate, wherein the first side is opposite to the second side,
wherein the width of the first power line at the first power-supplied node or the width of the second power line at the second power-supplied node is greater than the width at the other node on the first or the second power line, and
wherein a supply node on the conductive connecting line is used to provide the supplied power.

10. The system of claim 9, wherein the width of the first power line monotonically decreases away from the first power-supplied node, and the width of the second power line monotonically decreases away from the second power-supplied node.

11. The system of claim 10, wherein at least one edge of the first or the second power line is stepwise.

12. The system of claim 10, wherein at least one edge of the first or the second power line is continuous.

13. The system of claim 9, wherein the first power line, the second power line and the conductive connecting line are made on or in a chip, a printed circuit board or a package.

14. The system of claim 9, wherein the first power line and the second power line are laid out on a same level plane.

15. The system of claim 9, wherein the first power line and the second power line are laid out on different level planes.

16. The system of claim 9, wherein the conductive connecting line is laid out on a same level plane as either the first power line or the second power line.

17. The system of claim 9, wherein the conductive connecting line is laid out on a level plane different from that of either the first power line or the second power line.

18. The system of claim 9, wherein the supply node on the conductive connecting line is near a middle of the conductive connecting line.

* * * * *